United States Patent [19]
Barre

[11] Patent Number: 5,160,857
[45] Date of Patent: Nov. 3, 1992

[54] INTEGRATABLE TRANSISTOR SWITCH UNIT OF THE NTL LOGIC FAMILY

[75] Inventor: Claude Barre, Munich, Fed. Rep. of Germany

[73] Assignee: Siemens Aktiengesellschaft, Munich, Fed. Rep. of Germany

[21] Appl. No.: 638,785

[22] Filed: Jan. 8, 1991

[30] Foreign Application Priority Data

Jan. 11, 1990 [DE] Fed. Rep. of Germany ....... 4000665

[51] Int. Cl.$^5$ .............. H03K 19/092; H03K 19/088; H03K 19/094; H03K 19/003; H03K 19/013
[52] U.S. Cl. ..................... 307/446; 307/570; 307/454; 307/475; 307/558; 307/544; 307/443; 307/296.6; 307/300
[58] Field of Search .............. 307/443, 446, 454–455, 307/570, 300, 296.6

[56] References Cited

U.S. PATENT DOCUMENTS

| | | | |
|---|---|---|---|
| 4,266,238 | 5/1981 | Nishizawa | 307/475 X |
| 4,749,885 | 6/1988 | Gal | 307/45.4 |
| 4,825,108 | 4/1989 | Burton et al. | 307/475 |
| 5,001,365 | 3/1991 | Murabayashi et al. | 307/446 |
| 5,075,579 | 12/1991 | Ueno | 307/446 X |

FOREIGN PATENT DOCUMENTS

3900232A1 11/1989 Fed. Rep. of Germany .

*Primary Examiner*—David Hudspeth
*Attorney, Agent, or Firm*—Hill, Van Santen, Steadman & Simpson

[57] ABSTRACT

Although known circuit arrangements in NTL technology work just as fast as gates constructed in ECL technology, they have a transmission characteristic that is hardly useful in practice. In the NTL technology of the present disclosure, a transmission characteristic of the gates executed in NTL technology is modified by inserting MOS transistors such that they satisfy respective requirements of a logic circuit arrangement, even in combination with other logic circuit families.

11 Claims, 2 Drawing Sheets

INTEGRATABLE TRANSISTOR SWITCH UNIT OF THE NTL LOGIC FAMILY

BACKGROUND OF THE INVENTION

The invention is directed to an integratable transistor switching circuit of the NTL (non-threshold logic) family.

The fastest standard logic circuits on a silicon substrate currently work in ECL Technology (emitter-coupled-logic). In this technology, the beneficial properties of bipolar transistors are utilized, these being operated with currents and voltages below the saturation limit. A typical feature of this logic family is the connection of two bipolar transistors at their emitters. The base of one of these transistors serves as an input of the basic gate, whereas the base of the other transistor is charged with a constant voltage. The value of this voltage lies between the voltage values defined for the logical statuses of high and low. A reliable switching of the voltage value at the output given defined voltage values at the input of an ECL gate is thus guaranteed. The switching occurs by inhibiting the previously conductive transistor and by activating the previously inhibited transistor. Since, however, both transistors are connected at their emitters, the aggregate current of both emitter current paths is always constant and unequal to zero. In every logical status, thus power is consumed.

A logic family that works just as fast as the ECL Technology but which consumes power in only one of the two possible logical statuses is the logic family in NTL Technology (non-threshold logic). The basic gate of this logic family according to the reference of Rein/-Ranfft, "Integrierte Bipolarschaltungen", Springer-Verlag, 1987, page 191, incorporated herein, is formed of a bipolar transistor having a collector and an emitter resistor. A constant supply voltage is present between collector and emitter. The base of the transistor serves as a gate input and the collector serves as a gate output. The voltages present at the transistor are selected such that the transistor—as in ECL Technology—is never saturated. The logical statuses at the gate output are achieved by the activation or inhibiting of the transistor, and thus of the current path. Statistically considered, the power consumption in the NTL Technology is cut in half in comparison to the ECL Technology, this establishing a substantial advantage with respect to power consumption. Two reasons nonetheless oppose an employment of the NTL Technology. No complementary gate outputs as in ECL Technology are present, and the transmission characteristic of the NTL gates does not have a defined switching threshold and does not have a constant output voltage independent of the input voltage in any logical status. A defined switching threshold and constant logical voltage levels, however, are a basic prerequisite for realizing a malfunction-resistant logic circuit.

In order to make logic circuits of the NTL family useful in practice, techniques are therefore undertaken in order to make the negative properties of the NTL circuits controllable. One possible circuit-oriented technique is the variation of the voltage at the emitter side corresponding to the properties of the switching transistor. The transmission characteristic of the transistor is influenced by controlling a variable, but constant, supply voltage such that the curve of the transmission characteristic reaches an optimum. The only thing the obtainable optimum guarantees, however, is that the dependency of the output voltage on the input voltage of a gate can be predetermined, and thus, can be manipulated. A reliability of the switching functions that is comparable to the reliability known from ECL technology, however, cannot be achieved. The method of keeping the once-defined emitter resistance constant but varying the supply voltage at the emitter current path of the bipolar transistor harbors the disadvantage that an involved control circuit is required for the variable but constant supply voltage, since the voltage source must supply a relatively high current to the low-impedance circuit input.

SUMMARY OF THE INVENTION

An object on which the invention is based is to design logic circuits of the NTL family such that the switching reliability established in ECL technology is also created for the NTL technology.

According to the invention, an NTL integratable transistor circuit is provided having a bipolar transistor which is not driven in saturation, and which has collector and emitter resistances. A base of the bipolar transistor is connected to a signal input and the collector thereof is connected to a signal output. At the collector side, the bipolar transistor is supplied by a first, constant supply voltage. The emitter resistance is formed by at least two MOS transistors connected in series. The series circuit is connected to a second constant supply voltage. A variable supply voltage is applied at least to a high-impedance gate terminal of one of the MOS transistors and a third constant voltage is connected to at least on high-impedance gate terminal of the other MOS transistor.

What is to be considered critical for the invention is that the emitter resistor is replaced by the drain-source path of a MOS transistor. A series or parallel circuit of resistors and MOS transistors, instead of the emitter resistor, is also conceivable. The determining factor is that the overall resistance of the components replacing or supplementing the emitter resistor is variable such that the characteristic of the bipolar transistor can be influenced in a suitable way. When the emitter resistance is reduced, then, given a change of the logical status at the input, the output voltage level changes the logical status faster; and the transmission characteristic thus becomes steeper. The reason for this is that, given a smaller emitter resistance, a higher current can flow in the collector-emitter path of the bipolar transistor at the switching time under the condition that the voltages with which the transistor is operated remain constant.

When the favorable properties of the MOS transistor—high-impedance gate input and variation of resistance given a voltage variation of the gate-source path—are utilized in combination with a constant supply voltage at the emitter current path of the bipolar transistor, then the current through the collector-emitter path of the bipolar transistor can be influenced by varying the input voltage at the MOS transistor, and thus varying the emitter resistance. Accordingly, the transmission characteristic of the gate, given a defined voltage level at the input, has a steep curve in the direction of the logical status at the output opposite the logical status existing at the output. As a consequence of the high-impedance gate input resistance, the variable voltage source hardly needs to supply more current, and can therefore be realized in a simple way. An on-chip solution that can simultaneously service a plurality of MOS transistor inputs on the chip is possible.

The possibilities of operating the NTL gate with constant supply voltages are not yet exhausted. As a result of the insertion of further components into the emitter current path, a further possible influencing can be provided independently of the first possible influencing of the properties of the transistor circuit. By introducing components, preferably a MOS transistor, thus the current in the collector-emitter current path is limited. A MOS transistor having its drain-source path inserted into the emitter current path has its gate terminal charged with a third constant voltage, whereby the height of the gate-source voltage defines the value of the maximum current that can flow in the drain-source path of the MOS transistor, and thus in the collector-emitter current path of the bipolar transistor. With this current limitation, the current through the collector resistor is also limited, and thus so is the voltage that drops off at this resistor. The output of the logic gate lies between the collector of the bipolar transistor and the collector resistor. When the voltage drop-off at the collector resistor is limited, then the minimum output voltage of the gate is likewise limited. Two defined output voltage levels that are independent of the base input voltage of the bipolar transistor within relatively broad ranges can thus be realized in a NTL gate. When the bipolar transistor is inhibited, the output voltage level is identical to the level of the first constant supply voltage; when the bipolar transistor is transmissive, the output voltage level corresponds to the constant, first supply voltage minus the maximum voltage drop-off at the collector resistor—effected by the current limitation.

By introducing a unit that limits the current in the collector-emitter path of the bipolar transistor and by introducing a variable resistor in the same current path, thus the possibility of freely defining the transmission characteristic of the NTL gate within broad limits is thus created. In particular, an approximation of the NTL transmission characteristic to the transmission characteristic of gates in ECL technology is possible, i.e. the NTL technology can now be controlled, as a signal-to-noise ratio of the same size as is standard in ECL technology, and a direct coupling of the development of the circuit logic with the development of the circuit technology that was hitherto necessary is eliminated. On the contrary, there is the possibility of optionally interconnecting gates in ECL technology and in NTL technology in an arbitrary sequence on a single chip without signal matching, dependent on the demands made of the gate. When complementary outputs of a gate are not required, then a gate in NTL technology will preferably be selected due to the minimization of power that can be achieved. A disadvantage in view of the switching times does not thereby arise since the MOS transistors do not participate in the switching process of the gate, but serve only for setting the transmission characteristic, and thus the properties of the gate.

An additional possibility of optimizing the transmission characteristic of the NTL gate is comprised in connecting a basic load current path from the second constant current source via an ohmic resistor to the first constant current source via the MOS transistors situated in the emitter current path—past the bipolar transistor and collector resistor. The ohmic resistor, however, need not be directly connected to the first, constant supply voltage but must be merely connected to a potential that lies above the second constant supply voltage to such an extent that a permanent current that lies on the order of magnitude of 1% of the current that flows in the collector-emitter path given a through-connected bipolar transistor flows through the MOS transistors in the emitter branch. An even more exact switching point of the gate is achieved with this technique.

A flattening of the transmission curve of the NTL gate in the region of the switching point as a consequence of the gradual rise of the drain-source current given elevation of the gate-source voltage is thus avoided.

The gain of a bipolar transistor in emitter circuitry can, as is known, be increased toward higher frequencies on the basis of a capacitance in parallel to the emitter resistor due to the reduction of the degree of negative feedback of the transistor circuit. When the transistor is operated as a switch, as in the NTL gate, then the parallel connection of a capacitor vis-a-vis the emitter resistor shortens the switching time.

Many components are not realized in discrete form in the integration of components on a chip. On the contrary, all of the properties of the elements applied on the semiconductor substrate are utilized. Thus, for example, the coefficient of resistance of the interconnects on the chip serves the purpose of realizing the resistances necessary for the respective circuit, and parasitic capacitances of transistors can be intentionally utilized as capacitors that are required anyway in the circuit. Even the size of these components, i.e. the resistance and the capacitance, can be intentionally varied by varying the length and width of interconnects and by variation of the transistor surface. The MOS transistor driven with the variable but constant supply voltage is therefore designed such that it has a relatively high capacitance in addition to the required value of resistance. The area requirement of this MOS transistor on the chip is great, as a consequence of this technique. In order to reduce this area requirement, a bipolar transistor is connected in parallel to a series circuit of a MOS transistor driven with the variable supply voltage and an ohmic load, and its base is connected to the coupling point between the elements of the series circuit. The bipolar transistor connected in parallel in such fashion transforms the properties of the MOS transistor. Thus, the MOS transistor now requires a significantly smaller area so that the equivalent circuit formed of the MOS transistor, ohmic load, and bipolar transistor replaces the MOS transistor constructed, in large-area fashion, with full equivalency. The advantage of the equivalent circuit compared to the large-area MOS transistor is the lower space requirement of the equivalent circuit, so that a higher packing density is obtainable as a result thereof.

The NTL gate can be especially advantageously employed in combination with a circuit principle typical of ECL gates. ECL gates are often employed in series-gating circuitry in order to realize more complex functions and for flip-flops. What is referred to by series-gating is a serial logical operation wherein the current switches are arranged above one another and are supplied in common from one power source. When the power source is replaced by an NTL gate, then the possibility is thus created—on the basis of a simple logical drive of the NTL circuit with the logic levels standard in ECL technology—of optionally disconnecting the entire current of the higher-ranking ECL gates and of thus saving power. On the basis of a consistent application of this principle, assuming the possibility of miniaturizing the circuit structures, the packing density and thus the performance capability of semiconductor modules can be enhanced.

DESCRIPTION OF THE PREFERRED EMBODIMENTS

Figure 1:
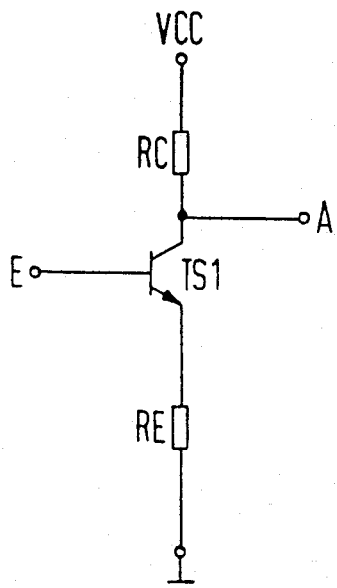
FIG. 1 is a circuit diagram of a known NTL-NOT gate.

FIG. 1 shows an NOT gate in known NTL technology With Which switching times in the sub-nanosecond range can be achieved without great technological expense. An npn-bipolar transistor TS1 in emitter circuitry serves as a switch element. The collector of the transistor TS1 that also forms the gate output A is connected via a collector resistor RC to a constant supply voltage VCC. The base of the transistor TS1 is directly employed without additional wiring as gate input E, whereas the emitter of the transistor TS1 is connected via an emitter resistor RE to a supply voltage, which is a reference voltage in the present case. The emitter resistor RE whose value of resistance is approximately 0.5 through 0.8 times as large as the value of the collector resistor RC, sees to it that the non-bipolar transistor TS1 does not proceed into saturation.

Figure 2:
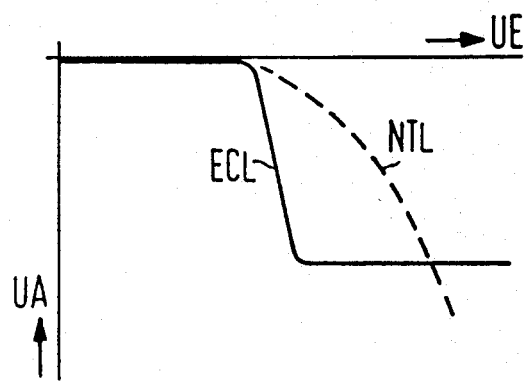
FIG. 2 shows the transmission characteristics of an ECL gate and of an NTL gate.

FIG. 2 shows the curve of the transmission characteristics that can be respectively achieved with gates of ECL or, respectively, NTL technology. In the range of low voltage values UE at the gate input E, the two characteristics coincide and have a flat curve. Given a change of the input voltage UE, the output voltage UA thus does not change. By contrast thereto, serious differences between the two characteristics appear toward higher input voltage values UE. Whereas the transmission characteristic of the ECL gate first has a pronounced change of the output voltage UA given a slight variation of the input voltage UE, i.e. proceeds steeply, and subsequently has a nearly constant output voltage UA over a broad range independently of the input voltage UE, the transmission characteristic of the NTL gate proceeds in comparatively flat fashion after reaching a threshold; and the voltage value of the output voltage UA remains a function of the input voltage UE until the voltage value of the voltage present at the respective point in time is reached. The steepness of the transmission characteristic of the NTL gate can be set by varying the value of the emitter resistor RE and by varying the supply voltage.

Figure 3:
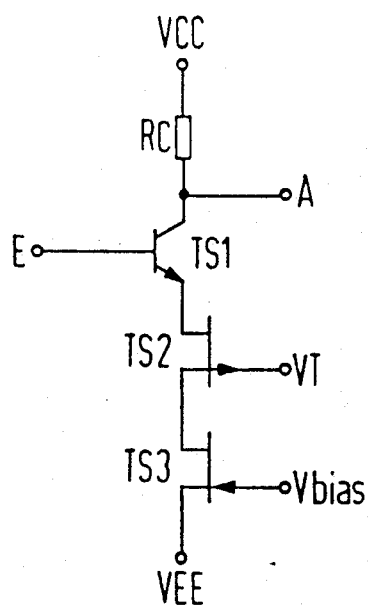
FIG. 3 is a circuit diagram of an inventively designed NTL-NOT gate.

By comparison to the circuit diagram of FIG. 1, the emitter resistor RE in FIG. 3 is replaced by a series circuit of a p-MOS and of an n-MOS field effect transistor TS2, TS3. A variable but constant supply voltage VT is connected to the gate of the p-MOS field effect transistor TS2, whereas a second constant supply voltage VEE is connected at the end of the emitter current path. A third constant voltage is present at the gate of the n-MOS field effect transistor TS3.

Figure 4:
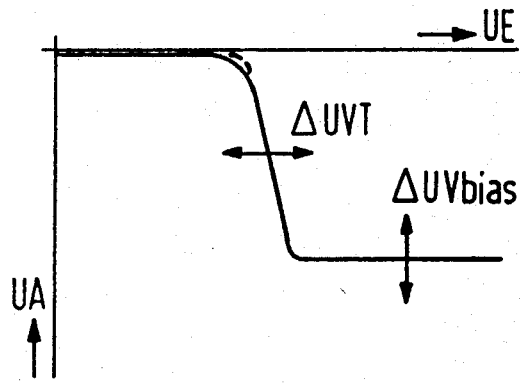
FIG. 4 illustrates the transmission characteristic with an indication of the effect of voltage changes at the gate electrodes of the MOS transistors for the NTL gate of FIG. 3.

The effect of this modification of the circuit compared to FIG. 1 is shown in FIG. 4. The transmission characteristic of the NTL gate now has a curve similar to the transmission characteristic of the ECL gate.

This fundamental curve of the NTL transmission characteristic obtained by introducing the series circuit of MOS transistors TS2, TS3 to replace the emitter resistor RE is determined on the basis of the geometric structure of the MOS transistors on the semiconductor chip for the purpose of defining the overall resistance of the components that replace the emitter resistor. The fine-tuning of the transmission characteristic is undertaken by varying the gate voltages UVT, UVbias. Given a conductive collector-emitter path of the bipolar transistor TS1, a variation of the gate input voltage UVbias at the n-MOS transistor TS3 effects a variation of the output voltage UA of the NTL gate. When the voltage UVT at the gate of the p-MOS field effect transistor TS2 is varied, then the threshold of the gate is shifted.

Figure 5:
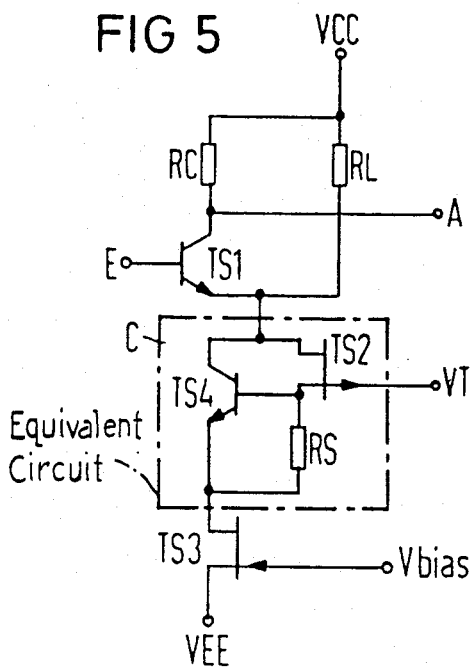
FIG. 5 shows an NTL gate modified in comparison to the NTL gate of FIG. 3 with a basic load, and with an equivalent circuit diagram for the MOS transistor driven with the variable voltage.
Figure 6:
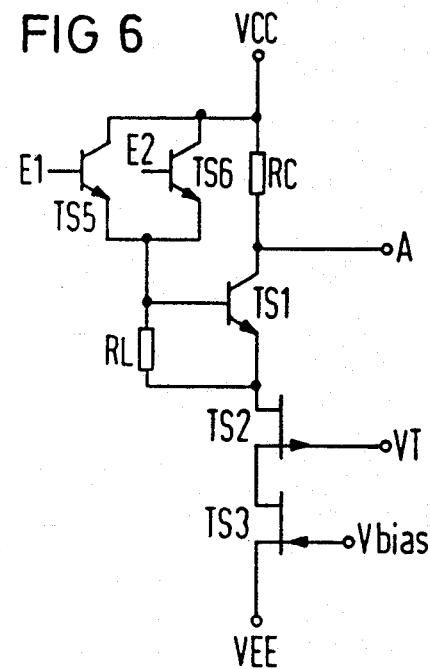
FIG. 6 illustrates a circuit diagram of an NTL-NOR gate with the basic load current path for the MOS transistors.

The curve of the transmission characteristic of the NTL gate shown with a solid line in FIG. 4 has the deficiency of a pronounced rounding when the threshold is approached. This deficiency can be eliminated by attaching a load resistor RL to the circuit of FIG. 3, as shown in FIGS. 5 and 6. In FIG. 5, the load resistor RL is situated between the constant supply voltage VCC and the emitter terminal of the bipolar transistor TS1. In FIG. 6, which represents a NOR gate, the load resistor RL is connected to the base and to the emitter of the bipolar transistor TS1. The base of the bipolar transistor TS1 thus does not serve directly as gate input E. On the contrary, the gate inputs E1, E2 are connected to the base of the switching transistor TS1 via bipolar transistors TS5, TS6 connected as emitter followers. In both of the instances shown in FIG. 5 and FIG. 6, a permanent current flows via the load resistor RL and via the two MOS transistors TS2, TS3 independently of the switching status of the gate. Given the presence of a defined voltage potential at the base of the bipolar switching transistor TS1, it is thus assured that a switch into the other logical status at the output A of the gate is undertaken without delay. The effect of the load resistor RL is illustrated in FIG. 4. Without the load resistor RL, the transmission characteristic changes in the region of the change from higher output voltage values UA to lower output voltage values UA in the manner shown with the broken line.

The circuit C in FIG. 5 shows an equivalent circuit for the p-MOS field effect transistor TS2 from FIG. 3. An ohmic resistor RS is connected in series with the p-MOS field effect transistor TS2; the collector-emitter path of a bipolar transistor TS4 whose base terminal is connected to the junction of the series-connected elements is connected in parallel to this series circuit. This equivalent circuit has the same electrical properties as the p-MOS field effect transistor TS2 from FIG. 3, but requires a smaller area on the semiconductor chip.

Figure 7:
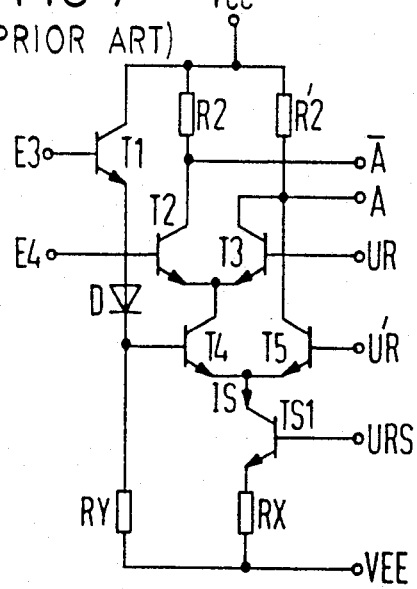
FIG. 7 is a typical circuit diagram of an AND/-NAND gate with a series-gating arrangement in ECL technology.

FIG. 7 shows a typical ECL-NAND/AND gate in a series-gating circuit. Two ECL gates are connected in series. The npn-bipolar transistors T2 and T3 form a first gate and the npn-bipolar transistors T4, T5 form a second gate. The emitters of the transistors T2, T3 are interconnected to the collector terminal of the transistor T4, and the emitters of the transistors T4, T5 are likewise interconnected with the collector of an npn-bipolar transistor TS1 that serves as a constant current source. Respective reference voltages UR, UR' and URS are connected to the base terminals of the transistors T3, T5 and TS1. The switching threshold of the respective gate is set with the reference voltages UR and UR' and the reference voltage URS effects a constant current IS in the collector-emitter current path of the transistor TS1. The collector of the transistor T2 serves as gate output A and is connected via a resistor R2 to the constant supply voltage VCC. The collectors of the transistors T3, T5 serve as gate output A and are connected in common via a resistor R2' to the constant voltage source VCC. The emitter of the transistor TS1 is connected via a resistor RX to the second constant supply voltage VEE. The base of the transistor T2 directly forms the input E4 of the gate, whereas the base of the transistor T4 indirectly serves as input E3 of the gate via a circuit arrangement for level matching. This circuit arrangement is a series circuit of an npn-bipolar transistor T1 having its collector connected to the constant supply voltage VCC and whose base terminal serves as input E3; a diode D polarized in a conducting direction; and a resistor RY that is connected to the second constant supply voltage VEE. The base of the transistor T4 is connected to the junction of the diode D with the resistor RY.

Figure 8:
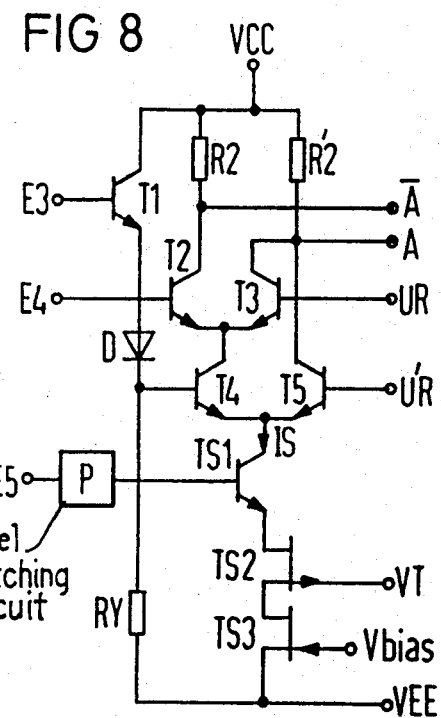
FIG. 8 shows the ECL gate of FIG. 7 modified by an additional NTL gate.

FIG. 8 shows the series-gating circuit of FIG. 7 wherein an NTL gate instead of the current source is inserted in the current path IS. The resistor RX is replaced by the series circuit of the p-channel MOS field effect transistor TS2 with the n-channel MOS field effect transistor TS3 shown in FIG. 3. Just as in FIG. 3, the p-channel transistor is connected with the variable constant supply voltage VT and the n-channel transistor is connected with the third constant voltage Vbias at the gate electrodes. The transistor TS1 is utilized as third gate input E5 via a schematically illustrated level matching circuit P. The current IS is defined by the third constant voltage Vbias. When the gate illustrated in FIG. 8 is not required for a certain time in a more complex circuit arrangement on a semiconductor chip, then it can be switched to a current free mode via the third gate input E5.

Although various minor changes and modifications might be proposed by those skilled in the art, it will be understood that I wish to include within the claims of the patent warranted hereon all such changes and modifications as reasonably come within my contribution to the art.

I claim as my invention:

1. An integratable transistor circuit of the NTL non-threshold logic family, comprising:
   at least one bipolar transistor having means including collector and emitter resistances for preventing driving of the transistor into saturation, wherein a base of the transistor is connected to a signal input and a collector of the transistor is connected to a signal output, and wherein the collector is connected through the collector resistance to a first constant supply voltage;
   said emitter resistance comprising at least first and second MOS transistors connected to form a series circuit, the series circuit being connected to a second constant supply voltage;
   a variable supply voltage connected at least to a high impedance gate terminal of one of the first and second MOS transistors; and
   a third constant voltage being connected to at least one high-impedance gate terminal of the other of the first and second MOS transistors.

2. An integratable transistor circuit according to claim 1 wherein the transistor driven by the variable supply voltage is of a p-channel type and the transistor driven by the third constant supply voltage is of an n-channel type.

3. An integratable transistor circuit according to claim 1 wherein a primary load current path is established between said first and second constant supply voltages and said first and second MOS transistors connected in series.

4. An integratable transistor circuit according to claim 1 wherein a bipolar transistor is connected in parallel to a series circuit formed of said MOS transistor driven with the variable supply voltage and a resistance, and wherein a base of the bipolar transistor is connected between the resistance and the MOS transistor driven with the variable supply voltage.

5. An integratable transistor circuit of the NTL non-threshold logic family in an ECL technology series-gating logic system, comprising:
   first and second ECL gate circuits having collector-emitter paths connected in series between a supply voltage and a reference potential;
   at least one bipolar transistor having a base connected to a level matching circuit, a collector connected through the first and second ECL gate circuits to the supply voltage, and an emitter connected to at least first and second MOS transistors connected to form a series circuit, the series circuit connecting the bipolar transistor to said reference potential;
   a first control voltage connected at least to a gate terminal of one of the first and second MOS transistors; and
   a second control voltage being connected to a gate terminal of the other of the first and second MOS transistors.

6. An integratable transistor logic circuit of the NTL non-threshold logic family, comprising:
   a bipolar transistor whose base is connected to a signal input, a collector connected to a signal output, and the collector also being connected through a collector resistance to a supply voltage;
   an emitter of the bipolar transistor connecting through first and second MOS transistors to a reference voltage;
   a first control voltage connected to a gate terminal of one of the first and second MOS transistors;
   a second control voltage connected to a gate terminal of the other of the first and second MOS transistors; and
   the first and second control voltages being selected to operate the logic circuit bipolar transistor in a non-saturated condition in each of its two logic states.

7. An integratable transistor logic circuit, comprising:
   a supply voltage and a reference voltage;

a bipolar transistor having its collector connecting through a collector resistance to the first constant supply voltage, its base connecting to an input, and its emitter connecting through first and second MOS transistors to the reference voltage;

the first MOS transistor being connected to a first control voltage which adjusts a threshold of the logic circuit and the second MOS transistor being connected to a second control voltage which adjusts an output level of the logic circuit;

an output cf the circuit connecting between the collector resistance and the bipolar transistor; and the supply voltage and first and second control voltages together with parameters of the first and second MOS transistors being chosen such that the bipolar transistor does not operate in saturation during normal logic switching operation.

8. A circuit according to claim 7 wherein a second bipolar transistor is connected in parallel across the first MOS transistor and a resistance connected in series with the first MOS transistor, and a base of the second bipolar transistor being connected between the first MOS transistor and the series resistance.

9. A circuit according to claim 7 wherein a load resistance is connected between the supply voltage and an emitter of the bipolar transistor.

10. A circuit according to claim 7 wherein a load resistance is connected between a base and an emitter of the bipolar transistor, wherein at least one additional bipolar transistor is connected between the supply voltage and a base of the bipolar transistor, and wherein said input of the circuit is a base of the additional bipolar transistor.

11. A circuit according to claim 10 wherein a further bipolar transistor is connected in parallel with the additional bipolar transistor, and wherein a base of said further bipolar transistor is a second input to the circuit.

* * * * *